(12) United States Patent
Fischbach et al.

(10) Patent No.: US 6,351,386 B1
(45) Date of Patent: Feb. 26, 2002

(54) COMPONENT SHIM FOR MOUNTING A COMPONENT ON A HEAT SPREADER

(75) Inventors: Clark Douglas Fischbach, West Dundee; Robert Alvin John Richter, Jr., Lake in the Hills, both of IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/805,794

(22) Filed: Mar. 13, 2001

(51) Int. Cl.$^7$ .................................................. H05K 7/70
(52) U.S. Cl. ........................ 361/704; 361/705; 361/707; 361/717; 361/718; 361/760; 361/807; 361/808; 257/675; 257/706; 257/717
(58) Field of Search ................................. 361/704, 705, 361/707, 709, 710, 712, 713, 717–720, 748, 758, 760, 763, 784, 790, 792, 795, 807–810, 813; 257/675, 706, 707, 712, 713, 717; 174/16.3, 250, 252

(56) References Cited

U.S. PATENT DOCUMENTS

| | | | | |
|---|---|---|---|---|
| 5,339,519 A | * | 8/1994 | Fortune | 29/840 |
| 5,920,462 A | * | 7/1999 | Glovatsky et al. | 361/760 |
| 6,084,777 A | * | 7/2000 | Kalidas et al. | 361/707 |
| 6,151,221 A | * | 11/2000 | Van Lerberghe | 361/774 |
| 6,198,052 B1 | * | 3/2001 | Omote et al. | 174/261 |
| 6,251,706 B1 | * | 6/2001 | Paniccia | 361/709 |

* cited by examiner

Primary Examiner—Leo P. Picard
Assistant Examiner—Boris L. Chervinsky
(74) Attorney, Agent, or Firm—Jeffrey K. Jacobs

(57) ABSTRACT

A component shim 310 is used with printed circuit boards 306 and heat spreaders 314, for example, where each of the printed circuit board 300 and heat spreader 314 has a surface 304, 312 that are in different spaced apart planes. A component 300 has one lead attached to the surface 304 of the printed circuit board 306. The component shim 310 has a conductive section 320 with an upper attachment layer 326 and a lower attachment layer 332 secured to opposed sides 322, 324 of the conductive section 320. The upper attachment layer 326 is secured to a bottom 308 of the component 300 and the lower attachment layer 332 is secured to a surface 312 of the heat spreader 314. The total thickness of the conductive section 320 and upper and lower attachment layers 326, 332 of the component shim 310 is substantially equal to a distance from the bottom 308 of the component 300 to the surface 312 of the heat spreader 314.

38 Claims, 3 Drawing Sheets

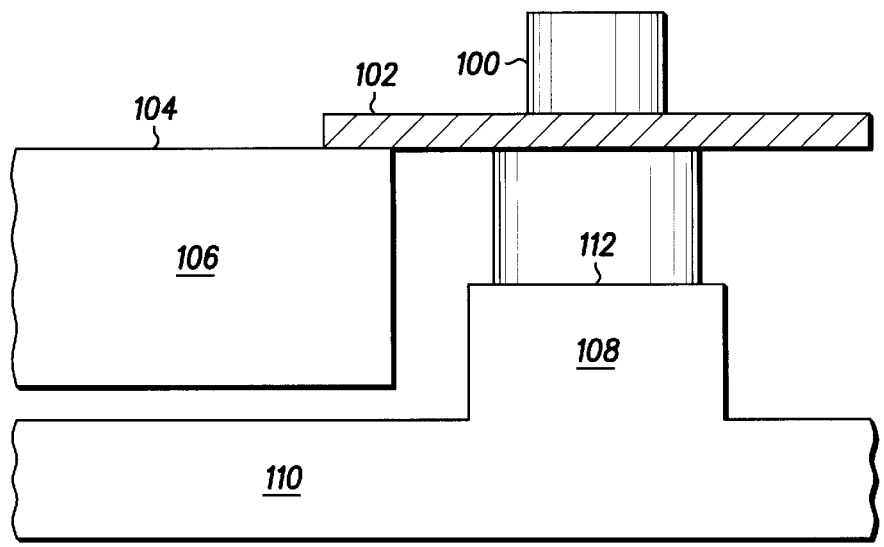
FIG. 1 - PRIOR ART -
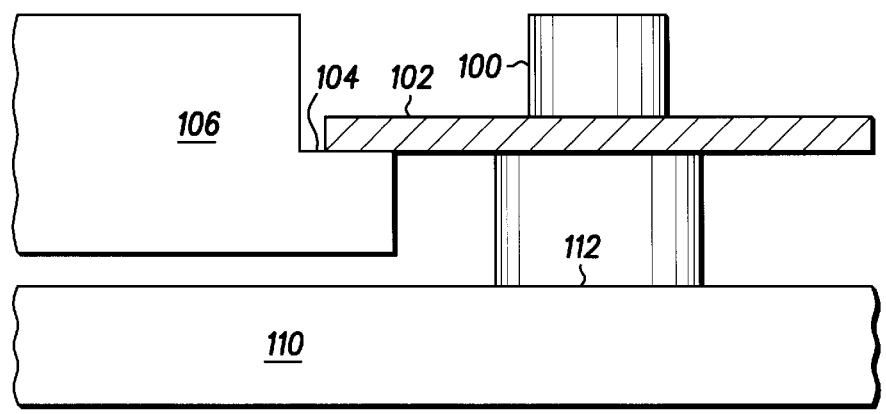
FIG. 2 - PRIOR ART -
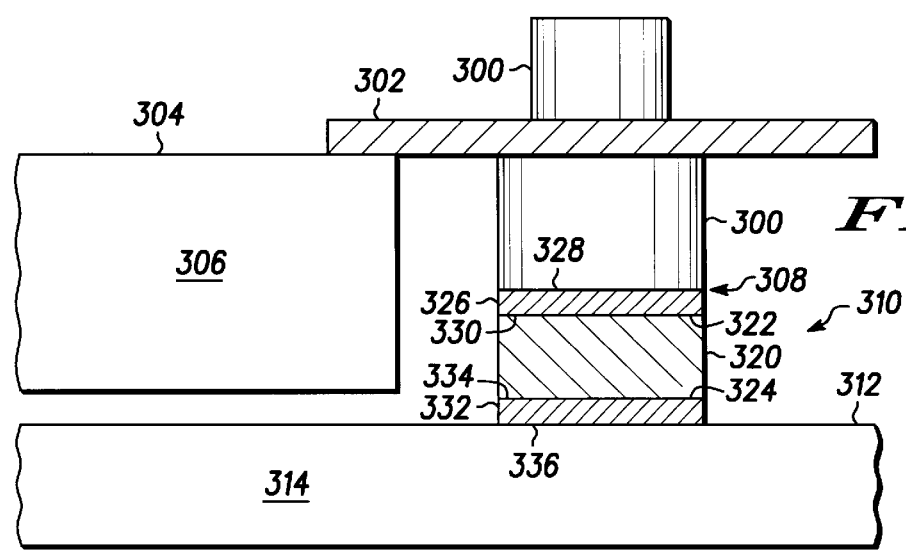
FIG. 3

COMPONENT SHIM FOR MOUNTING A COMPONENT ON A HEAT SPREADER

FIELD OF THE INVENTION

The present invention relates generally to the mounting of an electronic component on a heat spreader, and in particular to the mounting of an electronic component on a heat spreader with a connection of a terminal of the component to a printed circuit board.

BACKGROUND OF THE INVENTION

In the prior art, electronic components, such as RF (radio frequency) power transistors, are soldered to a circuit board and to a heat spreader. Typically, at least one of the leads of the RF power transistor is soldered to a pad on an edge of the circuit board and the base of the RF power transistor is soldered to a surface of the heat spreader. This requires that the soldering take place on multiple planes, that is the base of the transistor must be soldered to a heat spreader while the leads of the transistor are soldered to the top of the printed circuit board. It is desirable that this process be automated in order to reduce the cost of manufacturing. This soldering process is further complicated, however, by the fact that available RF power transistor packages have a seating plane height which is not always equal to the desired printed circuit board thickness. As a result, prior art methods of solder screening are not usable because a simple solder paste screening cannot be applied to multiple height levels in a single screening. Thus, hand application of solder paste is the only known method of applying solder paste to the base of the RF power transistor in the prior art.

Prior art solder preforms have been used for multi-plane soldering operations wherein the solder is applied to the base of the transistor for reflow. However, this is a hand operation because of the very weak mechanical rigidity of the preform, and thus is a poor candidate for automation.

FIGS. 1 and 2 depict prior art solutions for adjusting the height of the RF power transistor 100 so that the leads 102 of the RF power transistor 100 align with the surface 104 of the printed circuit board 106. To accomplish this, either a pedestal 108 is machined on the heat spreader 110 such that the bottom 112 of the RF power transistor 100 can be soldered to the pedestal 108 as shown in FIG. 1, or as shown in FIG. 2, the printed circuit board 106 is notched at surface 104 in order to adjust the height of the RF power transistor 100. These processes in the prior art provide a solution to the height differential at a very high dollar cost. This is because it requires a secondary machine procedure. Although it is known to add a metal shim to provide the pedestal function as depicted in FIG. 1, it is a hand operation that is required to dispense the solder onto the shim. This manual operation often results in solder shorts and yield loss. For higher power transistors and similar components it is necessary to use a heat spreader in order to dissipate the heat generated during operation of the RF power transistor. Heat spreaders are known that are composed of metallic materials, such as copper or aluminum, or are composed of non-metallic materials such as graphite. If necessary, as is also known in the prior art, a well is formed in the heat spreader 110 as opposed to the pedestal 108.

Consequently, a need exists for a structure which allows the component to be adjusted in height with regards to the spacing between the surface of the printed circuit board and the surface of the heat spreader. The prior art solutions all include a non-automated step which significantly adds to the cost of manufacturing. Furthermore, in the market for components, such as power transistors, there are very few suppliers and obtaining different size packages is not feasible. Therefore, there is a need for a solution which does not involve a custom package design for the component.

BRIEF DESCRIPTION OF THE DRAWINGS

The invention may best be understood by reference to the following description taken in conjunction with the accompanying drawings, the several figures of which like reference numerals identify like elements.

FIGS. 1 and 2 are cross sectional views of different prior art solutions for mounting an RF power transistor on a heat spreader and connecting it to a printed circuit board.

FIG. 3 is a cross-sectional view of the component shim according to the present invention.

DETAILED DESCRIPTION OF THE PREFERRED EMBODIMENT

Figure 4:
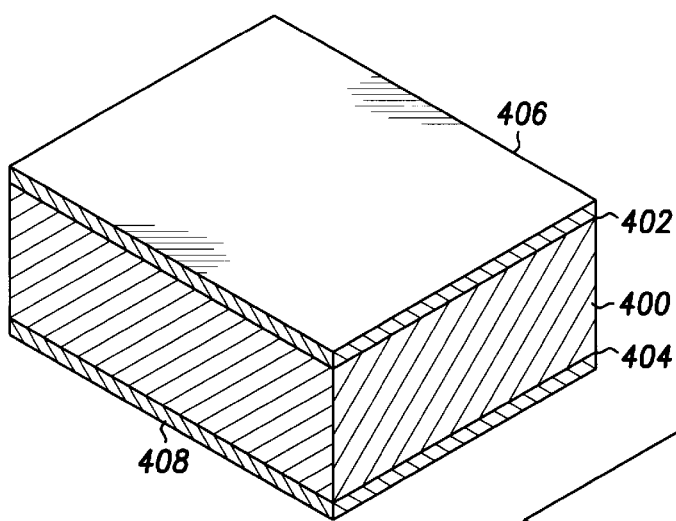
FIG. 4 is a perspective view of the FIG. 3 shim.

In general, the present invention is a component shim for use with first and second boards, such as a printed circuit board and a heat spreader, each of the first and second boards having surfaces which are spaced a predetermined distance apart. The component has at least one lead which is attached to the surface of the first board, or printed circuit board. The shim has a conductive section, having opposed first and second surfaces. An upper attachment layer has opposed first and second surfaces, the second surface thereof being secured to the first surface of the conductive section. A lower attachment layer has opposed first and second surfaces, the first surface thereof being secured to the second surface of the conductive section. The first surface of the upper attachment layer is secured to a bottom of the component and the second surface of the lower attachment layer is secured to the surface of the second board, that is, the heat spreader. A total thickness of the conductive section and the upper and lower attachment layers is substantially equal to a distance from the bottom of the component to the surface of the second board, when the leads of the component are attached to the first board. In one embodiment of the present invention, the component shim only has a conductive section and a lower attachment layer.

FIG. 3 depicts an embodiment of the present invention wherein an RF power transistor 300 has a lead 302 connected to a first surface 304 of a print circuit board 306. The RF power transistor 300 has a bottom surface 308 connected via the component shim 310 to the first surface 312 of the heat spreader 314. The component shim 310 has a conductive section 320 that has opposed first and second surfaces 322 and 324. The component shim 310 also has an upper attachment layer 326 which has a first surface 328 and a second surface 330. The second surface 330 is secured to the first surface 322 of the conductive section 320. A lower attachment layer 332 has a first surface 334 and a second surface 336. The first surface 334 of the lower attachment layer 332 is secured to the second surface 334 of the conductive section 320. The first surface 328 of the upper attachment layer 326 is secured to a bottom 308 of the component 300. The second surface 336 of the lower attachment layer 332 is secured to the surface 312 of the heat spreader 314. The total thickness of the component shim 310 is therefore substantially equal to a distance from the bottom 308 of the component 300 to the surface 312 of the heat spreader or second board 314.

It is to be understood that the RF power transistor 300 is used as an example, and that other components could be utilized with the present invention. For example, the present invention can be used with any higher power dissipating component where the resistance from the component to the heat spreader or heat sink to the ambient air has to be kept to a minimum. Also, the present invention can be used with any multi-terminal device in which there needs to be a height adjustment.

FIG. 4 depicts in perspective view one embodiment of the present invention in which the conductive section 400 is formed of a material such as copper so that it is both thermally and electrically conductive. The conductive section 400 has on its first and second surfaces 402, 404 an upper solder layer 406 and a lower solder layer 408, respectively. It should be pointed out that the conductive section 400 can be formed of other types of conductive metals other than copper. The component shim depicted in FIG. 4 thus has sufficient mechanical rigidity as to be used in automated processes. The solder layers 406 and 408 can be secured to the first and second surfaces 402 and 404, respectively, of the conductive section 400 by processes known in the prior art, such as a roll solder process. It is also to be understood that the configuration of the component shim, which in FIG. 4 is shown to be substantially square or rectangular, can have other geometric shapes depending upon the application. The present invention applies equally well to these other types of geometric shapes. Furthermore, it is not necessary that the solder layers 406 and 408 be uniformly applied across the surfaces 402 and 404 of the conductive section 400. The present invention thus allows for automated machinery to place the component shim on the heat spreader and thereafter place the RF power transistor onto the component shim with the leads attached to the printed circuit board. The application of heat then thermally and electrically secures the RF power transistor to the heat spreader. Thus the present invention eliminates the need for hand soldering or applying solder in any form by hand, at any point in the manufacturing process. The present invention also eliminates any machining of the heat spreader.

It is to be pointed out that the upper attachment layer 326 and the lower attachment layer 332 depicted in FIG. 3 do not necessarily have to be formed of a solder material, are materials can be used that such as epoxy-based materials. For example, epoxy resins can be used, or any other material which has good thermal and electrical conductivity properties. Also, in some applications it may only be necessary that thermal conduction be present and therefore a material for the upper and lower attachment layers could be one which is thermally conductive even though it may not be electrically conductive. In general, for conductivity, the conductive section 320 can be formed of materials such as copper, beryllium, aluminum, silicon carbide, copper, tungsten, extruded aluminum or powdered metal alloy. In the manufacturing assembly process the component shim is placed on the heat spreader and then the RF power component is placed on top of the component shim. When solder is used for the upper and lower attachment layers of the component shim, a convention reflow process is used to solder all of the parts together. Infrared application is also being increasingly used for soldering the components together. It should be further understood that the present invention can equally be used with prior art heat spreaders that have either pedestals or wells already in place. The component shim of the present invention can be utilized to adjust for height differences between the component, such as the RF power transistor, and the top of the pedestal or the bottom of the well in an existing heat spreader. This then allows for the use of standard packaging for the RF power transistor or other component. Thus, different thicknesses of the component shim can be used for different thicknesses of printed circuit boards that are used with the RF power transistors and the heat spreaders.

The prior art was not directed to the use of shims because the components, such as RF power transistor 300, were typically very expensive and were much more expensive than the cost of machining the pedestal onto the heat spreader. However, today the components have come down in cost and therefore the percentage of cost for machining the pedestal has risen dramatically. However, the component shim of the present invention provides a solution to reducing significantly the cost of manufacturing.

Figure 5:
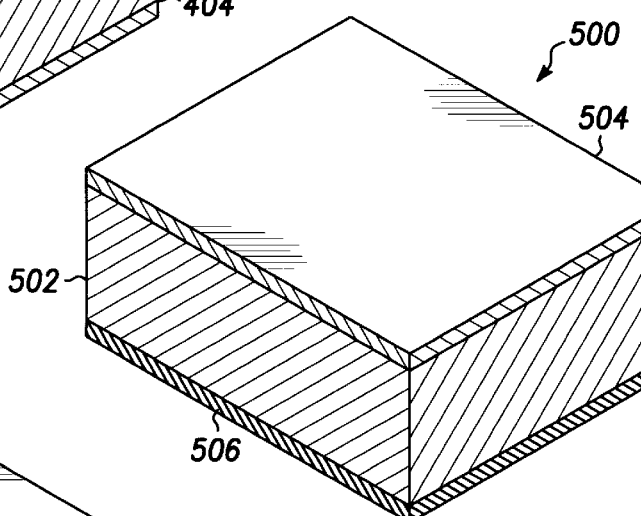
FIG. 5 is a perspective view of an alternative embodiment of the present invention.

FIG. 5 depicts another embodiment of the present invention wherein the component shim 500 has a conductive section 502 with an upper solder layer 504 and a lower solder layer 506. In this embodiment, the upper solder layer 504 is a low temperature solder and the lower solder layer 506 is a high temperature solder. This allows assembly in two different stages of the component shim to the heat spreader and the higher power transistor to the component shim. For example, it may be desirable that an outside third party source supplier assembles the component shim onto the heat spreader.

Figure 6:
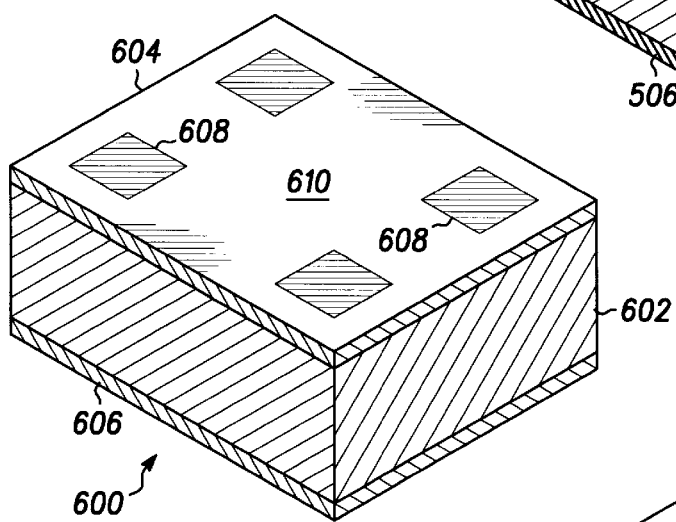
FIG. 6 is a perspective view of another alternative embodiment of the present invention.

In the embodiment depicted in FIG. 6 the component shim 600 has a conductive section 602 with upper and lower solder coatings 604 and 606. The upper solder coating 604 has dry adhesive areas 608 spaced on its upper surface 610. The dry adhesive areas 608 allow the component or RF power transistor to be temporarily held in place until the reflow process solders the RF power transistor to the component shim 600. Correspondingly, the dry adhesive layers can also be located on the surface of the lower solder layer 606 for positioning the component shim onto the heat spreader and holding it there temporarily.

Figure 7:
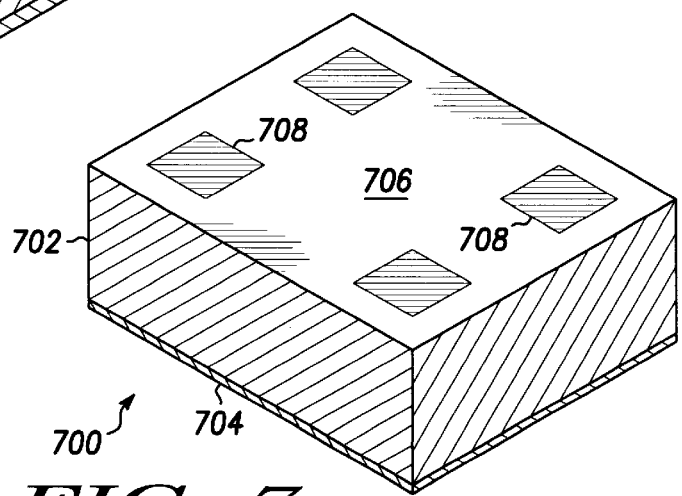
FIG. 7 is a perspective view of a further alternative embodiment of the present invention.

FIG. 7 shows yet another embodiment of the present invention wherein a conductive shim 700 has a conductive section 702 with a lower solder coating 704 and an upper surface 706 of the conductive section 702 having areas 708 of solder resist. The areas 708 of solder resist are used in applications wherein it is not desirable to solder across an entire surface 706 of the conductive section 702.

Figure 8:
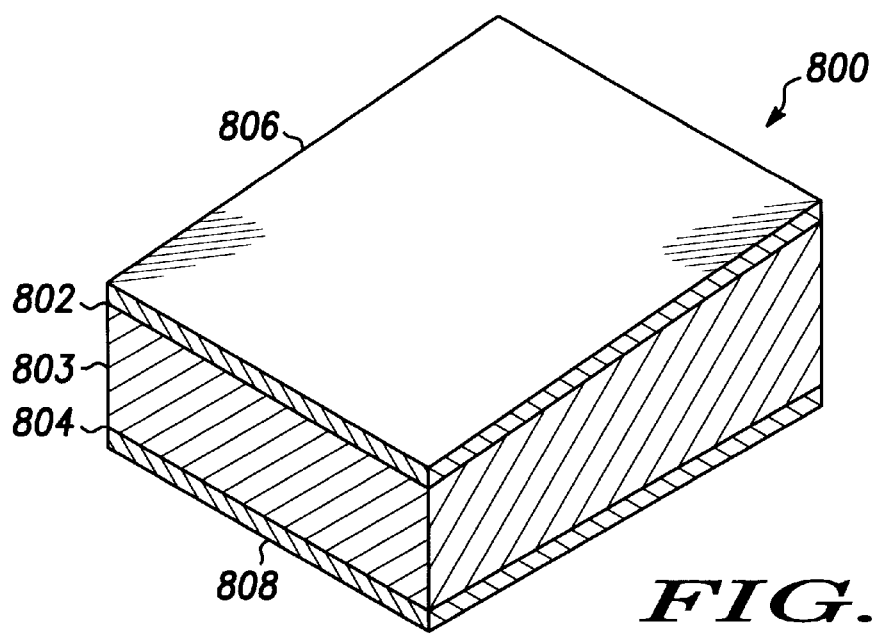
FIG. 8 is a perspective view of yet a further alternative embodiment of the present invention.
Figure 9:
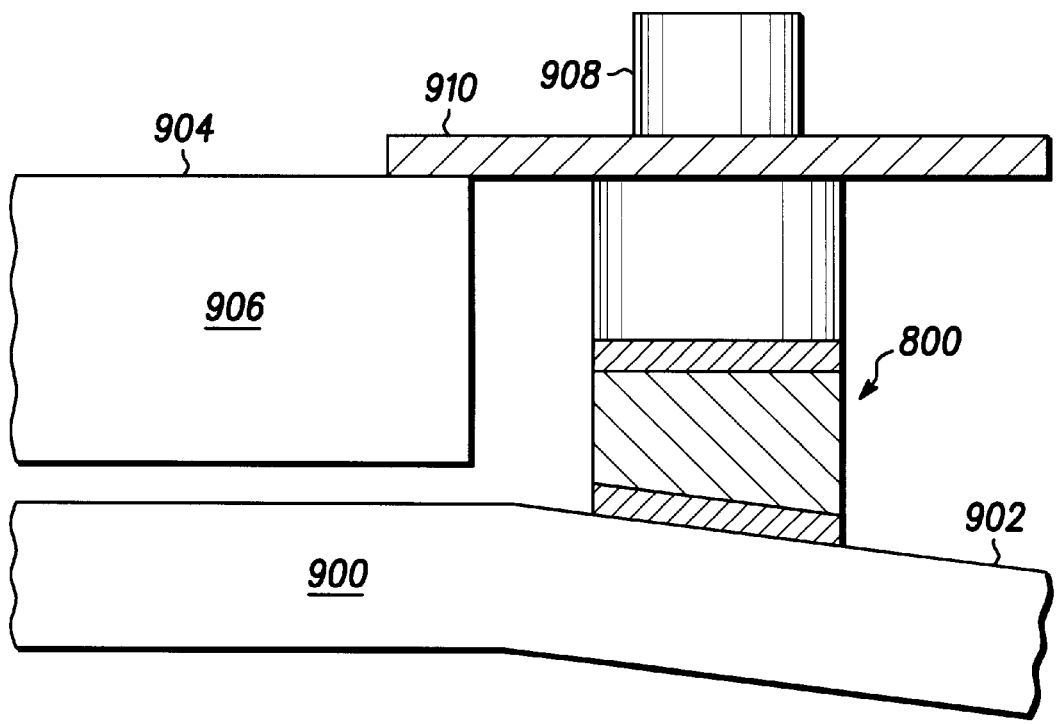
FIG. 9 is a cross-sectional view of the shim depicted in FIG. 8.

FIG. 8 shows yet another embodiment of the present invention in which the component shim 800 has non-parallel first and second surfaces 802 and 804. As previously described, the surface 802 has secured thereto an upper attachment layer, such as upper solder layer 806, and the lower surface 804 of the conductive section 803 has secured thereto a lower solder layer 808. An application of the component shim 800 is depicted in FIG. 9. In this application, the heat spreader 900 has in at least a portion thereof a surface 902 which is not parallel to a surface 904 of the printed circuit board 906. In order for the component 908, such as an RF power transistor, to have its lead 910 attached to the upper surface 904 of the printed circuit 906, the component shim must have the cross sectional configuration of a wedge. Assembly of the components is as described above. It is to be understood that various other configurations of the heat spreader relative to the printed circuit board are encompassed by the present invention. Also, although other materials could be used for the upper and lower attachment layers of the component shim, typically solder type materials such as preflux solder is typically utilized.

Thus, the present invention fulfills a need in the prior art for providing a device which eliminates hand manipulative steps in the process of assembling heat spreaders, components and printed circuit boards and further provides an economic solution to the problem of the prior art of adjusting for height differences between the printed circuit board, the component and the heat spreader. The present invention has the advantage that standard packaging can be utilized for the components and different thickness of printed circuit boards can be economically incorporated into the design of electronic equipment. This can be accomplished in the context of automatic assembly, thus reducing the manufacturing costs over the prior art methods.

The present invention is not limited to the particular details or the apparatus depicted and other modifications and applications are contemplated. Certain other changes may be made in the above-described apparatus without departing from the true spirit and scope of the invention herein involved. For example, different materials can be utilized for the upper and lower attachment layers of the component shim, and the component shim itself can have a variety of geometric configurations. It is intended, therefore, that the subject matter in the above depiction shall be interpreted as illustrative and not in a limiting sense.

What is claimed is:

1. A component shim for use with first and second boards, each of the first and second boards has a surface, the surfaces being spaced a predetermined distance apart, and a component having a lead attached at the surface of the first board, comprising:

a conductive section having opposed first and second surfaces;

an upper attachment layer having opposed first and second surfaces, the second surface thereof being secured to the first surface of the conductive section; and a lower attachment layer having opposed first and second surfaces, the first surface thereof being secured to the second surface of the conductive section;

wherein the first surface of the upper attachment layer is secured to a bottom of the component and the second surface of the lower attachment layer is secured to the surface of the second board, and wherein a total thickness of the conductive section and the upper and lower attachment layers is substantially equal to a distance from the bottom of the component to the surface of the second board.

2. The component shim according to claim 1, wherein the conductive section is formed of a material that conducts at least one of heat and electricity.

3. The component shim according to claim 1, wherein each of the attachment layers is formed of a solder-type material.

4. The component shim according to claim 1, wherein each of the attachment layers is formed of a pre-flux solder material.

5. The component shim according to claim 1, wherein the attachment layers have different melting points.

6. The component shim according to claim 1, wherein the lower attachment layer has a higher melting point than the upper attachment layer.

7. The component shim according to claim 1, wherein each of the attachment layers is formed of a material that conducts at least one of heat and electricity.

8. The component shim according to claim 1, wherein first and second surfaces of the conductive section are substantially parallel.

9. The component shim according to claim 1, wherein first and second surfaces of the conductive section lie in non-parallel planes.

10. The component shim according to claim 1, wherein the first surface of the upper attachment layer has at least one adhesive area located thereon for temporarily securing thereto the component.

11. The component shim according to claim 10, wherein the at least one adhesive area is formed from a material that is a dry adhesive material.

12. The component shim according to claim 10, wherein the at least one adhesive area is formed from a material that is a solder resist material.

13. The component shim according to claim 1, wherein the first board is a printed circuit board.

14. The component shim according to claim 1, wherein the second board is a heat spreader board.

15. A component shim for use with first and second boards, each of the first and second boards has a surface, the surfaces being spaced a predetermined distance apart, and a component having a lead attached at the surface of the first board, comprising:

a conductive section having opposed first and second surfaces; and a lower attachment layer having opposed first and second surfaces, the first surface thereof being secured to the second surface of the conductive section;

wherein the first surface of the conductive section is secured to a bottom of the component and the second surface of the lower attachment layer is secured to the surface of the second board, and wherein a total thickness of the conductive section and the lower attachment layers is substantially equal to a distance from the bottom of the component to the surface of the second board.

16. The component shim according to claim 15, wherein the conductive section is formed of a material that conducts at least one of heat and electricity.

17. The component shim according to claim 15, wherein the lower attachment layer is formed of a solder-type material.

18. The component shim according to claim 15, wherein the lower attachment layer is formed of a pre-flux solder material.

19. The component shim according to claim 15, wherein the lower attachment layer is formed of a material that conducts at least one of heat and electricity.

20. The component shim according to claim 15, wherein first and second surfaces of the conductive section are substantially parallel.

21. The component shim according to claim 15, wherein first and second surfaces of the conductive section lie in non-parallel planes.

22. The component shim according to claim 15, wherein the first surface of the conductive section has at least one area located thereon that is formed from a material that is a solder resist material.

23. The component shim according to claim 15, wherein the first board is a printed circuit board.

24. The component shim according to claim 15, wherein the second board is a heat spreader board.

25. A component alignment system, comprising:
- a component having at least first and second mounting portions;
- first and second boards, each of the boards having a surface, the surfaces being spaced a predetermined distance apart, and the boards having a predetermined orientation relative to one another, the first mounting portion of the component being attached to the surface of the first board;
- a component shim having a conductive section having opposed first and second surfaces, an upper attachment layer having opposed first and second surfaces, the second surface thereof being secured to the first surface of the conductive section, and a lower attachment layer having opposed first and second surfaces, the first surface thereof being secured to the second surface of the conductive section; and
- the first surface of the upper attachment layer secured to a bottom of the component, and the second surface of the lower attachment layer secured to the surface of the second board;
- wherein a total thickness of the conductive section and the upper and lower attachment layers is substantially equal to a distance from the bottom of the component to the surface of the second board.

26. The component alignment system according to claim 25, wherein the conductive section is formed of a material that conducts at least one of heat and electricity.

27. The component alignment system according to claim 25, wherein each of the attachment layers is formed of a solder-type material.

28. The component alignment system according to claim 25, wherein each of the attachment layers is formed of a pre-flux solder material.

29. The component alignment system according to claim 25, wherein the attachment layers have different melting points.

30. The component alignment system according to claim 25, wherein the lower attachment layer has a higher melting point than the upper attachment layer.

31. The component alignment system according to claim 25, wherein each of the attachment layers is formed of a material that conducts at least one of heat and electricity.

32. The component alignment system according to claim 25, wherein the surfaces of the first and second boards lie in substantially parallel planes to one another, and wherein the first and second surfaces of the conductive section are substantially parallel.

33. The component alignment system according to claim 25, wherein the surfaces of the first and second boards lie in substantially non-parallel planes to one another, and wherein the first and second surfaces of the conductive section lie in corresponding non-parallel planes.

34. The component alignment system according to claim 25, wherein the first surface of the upper attachment layer has at least one adhesive area located thereon for temporarily securing thereto the component.

35. The component alignment system according to claim 34, wherein the at least one adhesive area is formed from a material that is a dry adhesive material.

36. The component alignment system according to claim 34, wherein the at least one adhesive area is formed from a material that is a solder resist material.

37. The component alignment system according to claim 25, wherein the first board is a printed circuit board.

38. The component alignment system according to claim 25, wherein the second board is a heat spreader board.

* * * * *